United States Patent [19]

Fisher

[11] Patent Number: 4,472,459
[45] Date of Patent: Sep. 18, 1984

[54] LOCAL OXIDATION OF SILICON SUBSTRATE USING LPCVD SILICON NITRIDE

[75] Inventor: Albert W. Fisher, Hunterdon, N.J.

[73] Assignee: RCA Corporation, New York, N.Y.

[21] Appl. No.: 545,048

[22] Filed: Oct. 24, 1983

[51] Int. Cl.³ .................. H01L 21/318; H01L 21/76
[52] U.S. Cl. .................................... 427/93; 25/576 W; 156/659.1; 156/662; 156/653; 156/657; 427/94
[58] Field of Search .............. 427/93, 94; 29/576 W; 430/314; 156/659.1, 662, 653, 657

[56] References Cited

U.S. PATENT DOCUMENTS

| 4,279,947 | 7/1981 | Goldman | 427/94 |
| 4,333,964 | 6/1982 | Ghezzo | 427/93 |
| 4,363,868 | 12/1982 | Takasaki | 427/94 |

OTHER PUBLICATIONS

Appels et al., "Local Oxidation of Silicon and . . . ," Philips Res. Repts., vol. 25, 118-132, 4-1970.
Appels et al., Philips Research Reports, vol. 26, No. 3, pp. 157-165, 1971.

Primary Examiner—John D. Smith
Attorney, Agent, or Firm—B. E. Morris; R. H. Swope

[57] ABSTRACT

The formation of silicon dioxide isolated silicon islands on the surface of a substrate is improved by utilizing as an oxidation mask a patterned layer of silicon nitride which is deposited by LPCVD directly onto the surface of the silicon wafer. The subject method substantially reduces the incidence of stress related defects in the silicon surface and therefore eliminates the need for a layer of pad oxide which, if present, would cause "bird's beak" formation.

6 Claims, 3 Drawing Figures

LOCAL OXIDATION OF SILICON SUBSTRATE USING LPCVD SILICON NITRIDE

This invention relates to a method of forming silicon dioxide isolated silicon islands on a substrate.

BACKGROUND OF THE INVENTION

In the design of high density, CMOS large scale integrated circuits, it is necessary to provide effective insulation between circuit components in and on a silicon substrate. A convenient and effective means of providing such insulation is to grow a thick field oxide where desired to segregate and protect circuit components. The technique of oxidation of the silicon to form such isolated islands is recognized as being very advantageous.

It is common to utilize silicon nitride as an oxidation mask for the local oxidation of silicon to form insulated islands of silicon. It is recognized, however, that silicon nitride deposited directly onto the surface of the wafer causes defects to be formed in the silicon due to intrinsic stress in the silicon nitride film. The difference in thermal expansion between the silicon and silicon nitride adds significantly to the defect-producing stresses.

The problem of stress-induced defects in silicon caused by the above-described process has been solved by the use of what has been termed a "pad oxide" layer. This is a thin layer of silicon dioxide, i.e. about 500 angstroms or less, grown on the silicon surface prior to deposition of the silicon nitride. The use of a layer of pad oxide relieves the stress generated by the silicon nitride and, therefore, substantially eliminates defects in the silicon. However, although the use of a pad oxide relieves one problem, it has been found to create another.

It has been found that the use of a layer of pad oxide gives rise to what is commonly referred to as a "bird's beak" structure. In the isolation oxidation process using a pad oxide and a patterned layer of silicon nitride as a mask, the pad oxide causes enhanced lateral oxidation of the silicon under the silicon dioxide layer. The laterally forming oxide is thickest at the silicon nitride edge and it tapers as it penetrates under the edge of the silicon nitride. Lateral oxide penetration of from 0.6 to 1.5 micrometers is common. The penetration of lateral oxidation, in cross sectional profile, generally resembles a bird's head and beak. In accordance with this invention, a method has been found that significantly reduces both the aforementioned stress problems and the "bird's beak" formation.

SUMMARY OF THE INVENTION

Local oxidation of a silicon substrate utilizing silicon nitride as an oxidation mask is carried out without stress related problems and without the formation of "bird's beak" by depositing the silicon nitride directly onto the silicon substrate by low pressure chemical vapor deposition techniques.

BRIEF DESCRIPTION BY THE FIGURES

FIG. 1 is a photomicrograph of a cross section of a locally oxidized silicon substrate prepared by a standard procedure utilizing a pad oxide under the silicon nitride mask. Extensive lateral oxidation under the silicon nitride layer has caused a "bird's beak" configuration and significantly reduced the abruptness of the silicon island edge.

FIG. 2 is a photomicrograph of a cross section of a locally oxidized silicon substrate that was etched to remove 3200 angstroms of silicon from a selected portion of the surface prior to oxidation, and prepared in accordance with this invention. The photomicrograph shows a "bird's head" structure characteristic of samples that have been selectively etched prior to oxidation. However, the "bird's beak" is only about 0.15 micrometer long and the edge of the silicon island is abrupt.

FIG. 3 is a photomicrograph of a cross section of the structure of FIG. 2 after removal of the nitride masking layer and growth of approximately 1500 angstroms of gate oxide.

DETAILED DESCRIPTION OF THE INVENTION

Figure 1:
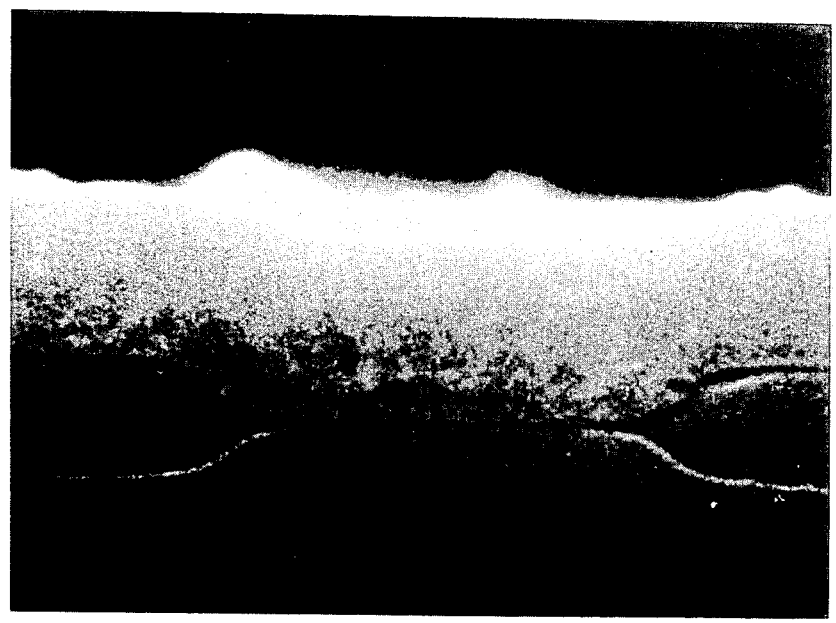

The silicon substrate treated in accordance with this invention is typically a single crystal silicon wafer which contains n-type and p-type regions where various active and passive devices such as transistors, diodes, resistors and the like will be fabricated after the isolation structure is completed. The substrate could likewise be another structure having a coating of silicon. The subject method is directed to a means of effectively isolating such devices on the substrate by selective local oxidation. The devices are ultimately connected to form a circuit pattern.

In accordance with this invention, silicon nitride, which will function as an oxidation mask, is deposited directly on the silicon substrate by low pressure chemical vapor deposition (LPCVD) from a source of silicon such as the hydride, i.e. silane, or a halogenated compound such as silicon dichloride or tetrachloride, and a source of nitrogen, e.g. ammonia. Deposition of silicon nitride by LPCVD is generally carried out at a pressure of about 0.7 torr and a temperature of from about 775° to 825° C.

Deposition of silicon nitride by LPCVD is effected in a conventional appartus such as, for example, a horizontal quartz tube furnace. It may be desired to flow the reactants into such an apparatus in admixture with an inert diluent or carrier gas. When the silicon source is silane, hydrogen is typically the diluent gas. When the halogenated compounds are utilized, the diluent gas is typically hydrogen or nitrogen. It is preferred to utilize the reactants without a carrier gas.

The film of silicon nitride deposited over the silicon substrate in accordance with this invention is from about 700 to 1300 angstroms, preferably about 1000 angstroms, in thickness. This is a significant reduction over conventional silicon nitride films which are generally about 2000 angstroms thick. The film of silicon nitride is deposited directly onto the silicon substrate, again in contrast to conventional procedures which require the use of a pad oxide layer. Since the present method does not require a pad oxide, the problem of formation of a "bird's beak" is substantially eliminated. Although lateral oxidation does occur to a degree even with the silicon nitride films of this invention, the "bird's beak" formation does not take place to the extent that it causes loss of dimentional control of the structure.

After the layer of silicon nitride has been deposited on the substrate, a predetermined portion is removed by conventional lithographic techniques, i.e. a layer of resist material is formed thereover, pattern irradiated and developed. The portion of the silicon nitride layer exposed by development of the resist layer is then removed by conventional etching with, e.g. reactive ion plasma etching or wet chemical etching techniques.

After removal of a portion of the silicon nitride mask, a layer of oxide is grown on the exposed silicon to form the isolation regions. This oxide layer is generally from about 6,000 to 12,000 angstroms thick. The remaining silicon nitride layer is then removed thus exposing the surface of the isolated islands of silicon. It is preferred to etch that portion of the substrate to be covered with the isolation oxide to remove from about 3,000 to 6,000 angstroms of silicon prior to disposition of the isolation oxide. The silicon is is preferably plasma etched using the resist-covered, patterned nitride layer as an etch mask. This produces a more planar surface of the structure after the oxide has been grown and the remaining silicon nitride removed. The method of this invention is advantageous for a number of reasons. First, the time and cost of forming the pad oxide layer is saved due to its elimination. Second, because the LPCVD silicon nitride layer is thinner than has been heretofore used as an oxide mask, there is less stress between it and the silicon substrate. The deposition of the silicon nitride film by LPCVD also produces less intrinsic stress in the film itself in comparison to a similar film deposited at, e.g., 900° C., in an atmospheric pressure reactor. This reduction in stress produces a marked decrease in the number of defects which are formed in the underlying silicon surface. Third, the elimination of the pad oxide prevents the formation of the "bird's beak" oxidation structure to the extent that it would have a detrimental effect on the abruptness of the silicon island.

The elimination of "bird's beak" structure is important because one is again able to precisely control the size of the isolated region. Control of the isolated region is important in the manufacture of high-density bulk CMOS circuits, particularly for structures having a gate width of 1 to 5 micrometers. A one micrometer "bird's beak" penetration on either side of a 5 micrometer gate—for example, would reduce its effective size by 40 percent. If allowance must be made for such reductions by space allocation, active device area must be wasted and component density significantly reduced.

Turning to the FIGURES, FIG. 1 is a photomicrograph of a silicon substrate in cross-section clearly illustrating an example of "bird's beak" formation. The layer of silicon dioxide can be seen extending inwardly from both sides of the photomicrograph in a classic "bird's beak" extension and terminating at the pad oxide. The layer of silicon nitride overlies the "beaks" and the pad oxide. The rounding of the silicon island with loss of dimentional control can readily be appreciated from FIG. 1.

Figure 2:
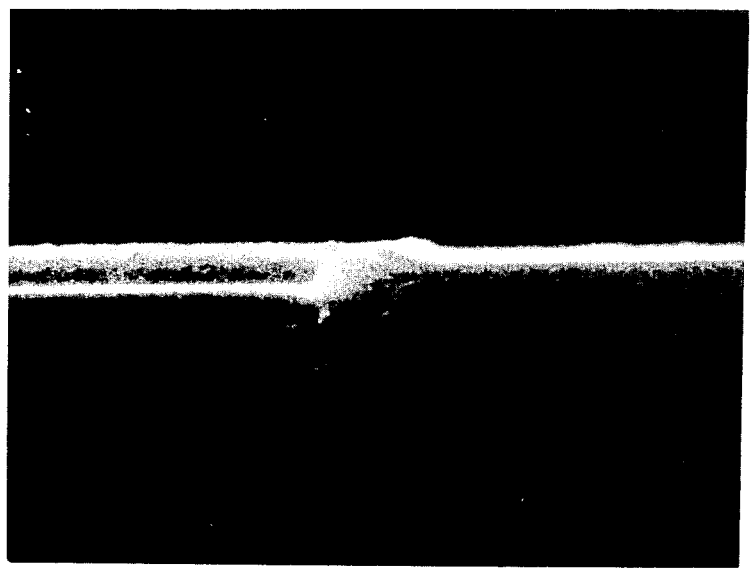

In contrast, FIG. 2 depicts the improvement provided by the subject method. In FIG. 2, the layer of silicon dioxide extends from the right toward the silicon island where it terminates forming a small beak under the silicon nitride. The silicon was etched to remove about 3200 angstroms in those areas where oxidation would take place. This produces a more planar surface in the structure after the oxide has been grown. While it is apparent that some lateral oxidation has taken place, it is evident that the formation of a significant "bird's beak" has been prevented. More important, the edge of the silicon island is abrupt and its size well controlled.

Figure 3:
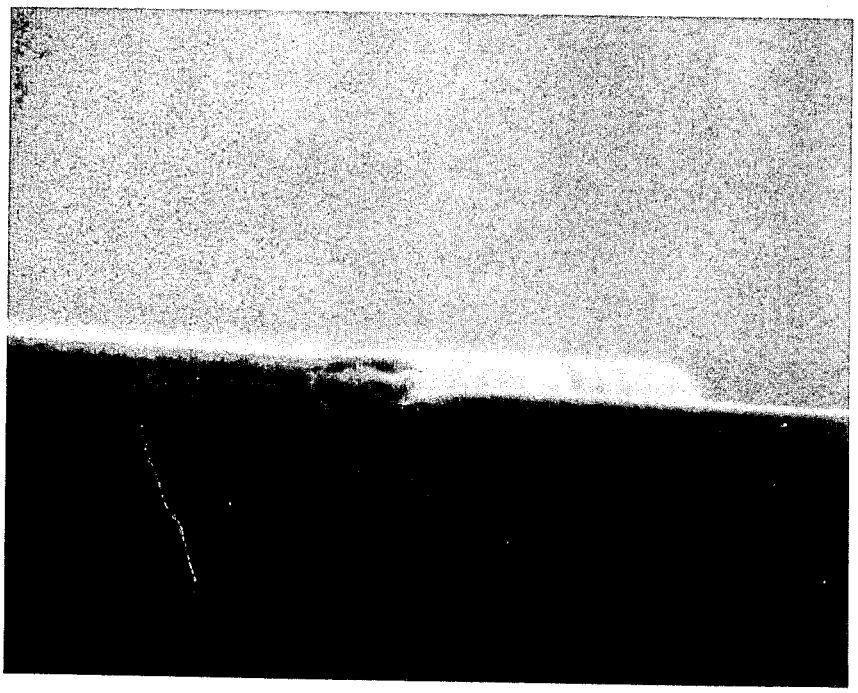

In FIG. 3, the layer of silicon nitride has been removed from the structure shown in FIG. 2 and a layer of gate oxide grown over the structure by thermal oxidation. FIG. 3 shows that the edge of the silicon island is still abrupt. This provides good dimentional control of the silicon islands which is critical to the fabrication of devices having configuration in the 1-5 micrometer range.

The following Example further illustrates this invention, it being understood that the invention is in no way intended to be limited to the details described therein. In the Example, all parts and percentages are on a weight basis and all temperatures are in degrees Celsius, unless otherwise stated.

EXAMPLE

Groups of five n-type single crystalline silicon wafers, 75 mm in diameter, were utilized as substrates. A first group, representing the conventional pad oxide procedure, was heated in steam at about 800° to form a layer of silicon dioxide about 400 angstroms thick.

The first group and a second group which did not receive a coating of pad oxide were coated in a conventional LPCVD reactor vessel at 0.7 torr and 800° utilizing a gas mixture of 30 sccm of dichlorosilane and 90 sccm ammonia. The coating of silicon nitride was 1500 angstroms in thickness on the first group and 1000 angstroms on the second group. A predetermined portion of the silicon nitride layer on each wafer was removed using standard lithographic procedures.

Using the patterned silicon nitride layer as a mask, the exposed silicon in the wafers of the second group was chemically etched with a 30 percent aqueous solution of potassium hydroxide at 50°. Etching was continued for 4.5 minutes during which 3200 angstroms of silicon was removed. The wafers were removed from the etching solution, rinsed thoroughly and dried.

All wafers were then oxidized by heating in steam at 1100° to form about 7500 angstroms of silicon dioxide in those areas not covered by the silicon nitride. The wafers were examined for formation of a "bird's beak" at the edge of the silicon islands. The wafers in the first group utilizing a layer of pad oxide exhibited pronounced "bird's beak". Those in the second group, although showing minor lateral oxidation, were essentially free of "bird's beak". FIG. 1 is a photomicrograph of a representative interface from the first group clearly showing "bird's beak" development. FIG. 2 is a photomicrograph of a representative interface from the second group clearly showing the improvement realized with the method of this invention.

The wafers in the second group were treated with phosphoric acid at 55° to remove the silicon nitride layer. Examination of the underlying silicon surface revealed only minimal evidence of stress related damage to the wafer surface. The wafers were heated in steam at 800° to form a layer of thermal oxide 1500 angstroms thick thereover. FIG. 3 is a photomomicrograph of a representative interface from the second group after growth of the oxide layer clearly showing that the abrupt edge of the silicon island remained intact.

I claim:

1. A method of forming a layer of silicon dioxide on a predetermined portion of a single crystalline silicon substrate comprising: depositing a single mask layer of silicon nitride about 700 and 1300 angstroms thick directly on the substrate by low pressure chemical vapor deposition; removing a predetermined portion thereof thus exposing the substrate; and forming silicon dioxide on the exposed substrate.

2. A method in accordance with claim 1, wherein said layer of silicon nitride is deposited from a mixture of dichlorosilane and ammonia at a temperature of from about 775° to about 825° C. and a pressure of about 0.7 torr.

3. A method in accordance with claim 1, wherein said layer of silicon nitride is about 1000 angstroms in thickness.

4. A method in accordance with claim 1, wherein the portion of the silicon nitride layer is removed by forming a patterned layer of a resist material thereover and etching the portion of the silicon nitride layer not covered by the resist layer.

5. A method in accordance with claim 1, wherein a predetermined portion of the exposed silicon substrate is removed prior to forming the oxide.

6. A method in accordance with claim 5, wherein the silicon substrate is etched utilizing the patterned layer of silicon nitride as an etch mask.

* * * * *